US012676605B2

(12) United States Patent
Nagasawa

(10) Patent No.: US 12,676,605 B2
(45) Date of Patent: Jul. 7, 2026

(54) SEMICONDUCTOR DEVICE

(71) Applicants: KABUSHIKI KAISHA TOSHIBA, Tokyo (JP); Toshiba Electronic Devices & Storage Corporation, Tokyo (JP)

(72) Inventor: Hironori Nagasawa, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 22 days.

(21) Appl. No.: 18/819,019

(22) Filed: Aug. 29, 2024

(65) Prior Publication Data

US 2025/0286546 A1      Sep. 11, 2025

(30) Foreign Application Priority Data

Mar. 8, 2024      (JP) ................................. 2024-036065

(51) Int. Cl.
| | |
|---|---|
| *H03K 17/08* | (2006.01) |
| *H02H 3/08* | (2006.01) |
| *H03K 17/0812* | (2006.01) |

(52) U.S. Cl.
CPC ......... H03K 17/08122 (2013.01); H02H 3/08 (2013.01)

(58) Field of Classification Search
CPC ................ H03K 17/08; H03K 17/081; H03K 17/08104; H03K 17/0812; H03K 17/08122; H03K 17/10; H03K 17/102; H03K 17/12; H03K 17/122; H03K 17/16; H03K 17/161;
(Continued)

(56) References Cited

U.S. PATENT DOCUMENTS

| | | |
|---|---|---|
| 9,118,180 B2 | 8/2015 | Yasuda et al. |
| 10,186,946 B2 | 1/2019 | Araki |
| 11,092,624 B2 | 8/2021 | Sato |
| (Continued) | | |

FOREIGN PATENT DOCUMENTS

| | | |
|---|---|---|
| JP | 2000299923 A | 10/2000 |
| JP | 2010154655 A | 7/2010 |
| (Continued) | | |

*Primary Examiner* — Long Nguyen
(74) *Attorney, Agent, or Firm* — Maier & Maier, PLLC

(57) ABSTRACT

According to one embodiment, a semiconductor device includes a first terminal, a second terminal, a first transistor, a first circuit including a second transistor, and a second circuit including a first resistance element, a second resistance element, and a first switch element. A gate of the first transistor are coupled to a first node. A gate of the second transistor are coupled to a second node. One end and the other end of the first resistance element are coupled to the second node and the first node, respectively. One end and the other end of the second resistance element are coupled to a third node and the first node, respectively. The first switch element switches coupling and uncoupling between the second and third nodes. The second circuit adjusts a voltage difference between a gate voltage of the second transistor and a gate voltage of the first transistor by switching.

13 Claims, 9 Drawing Sheets

(58) Field of Classification Search

CPC ...... H03K 17/162; H03K 17/687; H03H 3/08;
H03H 3/10; H03H 3/105

See application file for complete search history.

(56) References Cited

U.S. PATENT DOCUMENTS

| | | | | |
|---|---|---|---|---|
| 11,515,870 | B2 * | 11/2022 | Son | H03K 17/122 |
| 2018/0004238 | A1 * | 1/2018 | Shen | G05F 1/462 |
| 2022/0029410 | A1 | 1/2022 | Fukuhara | |

FOREIGN PATENT DOCUMENTS

| | | | |
|---|---|---|---|
| JP | 5594546 | B2 | 8/2014 |
| JP | 2018182818 | A | 11/2018 |
| JP | 2020173194 | A | 10/2020 |
| JP | 7132022 | B2 | 8/2022 |

* cited by examiner

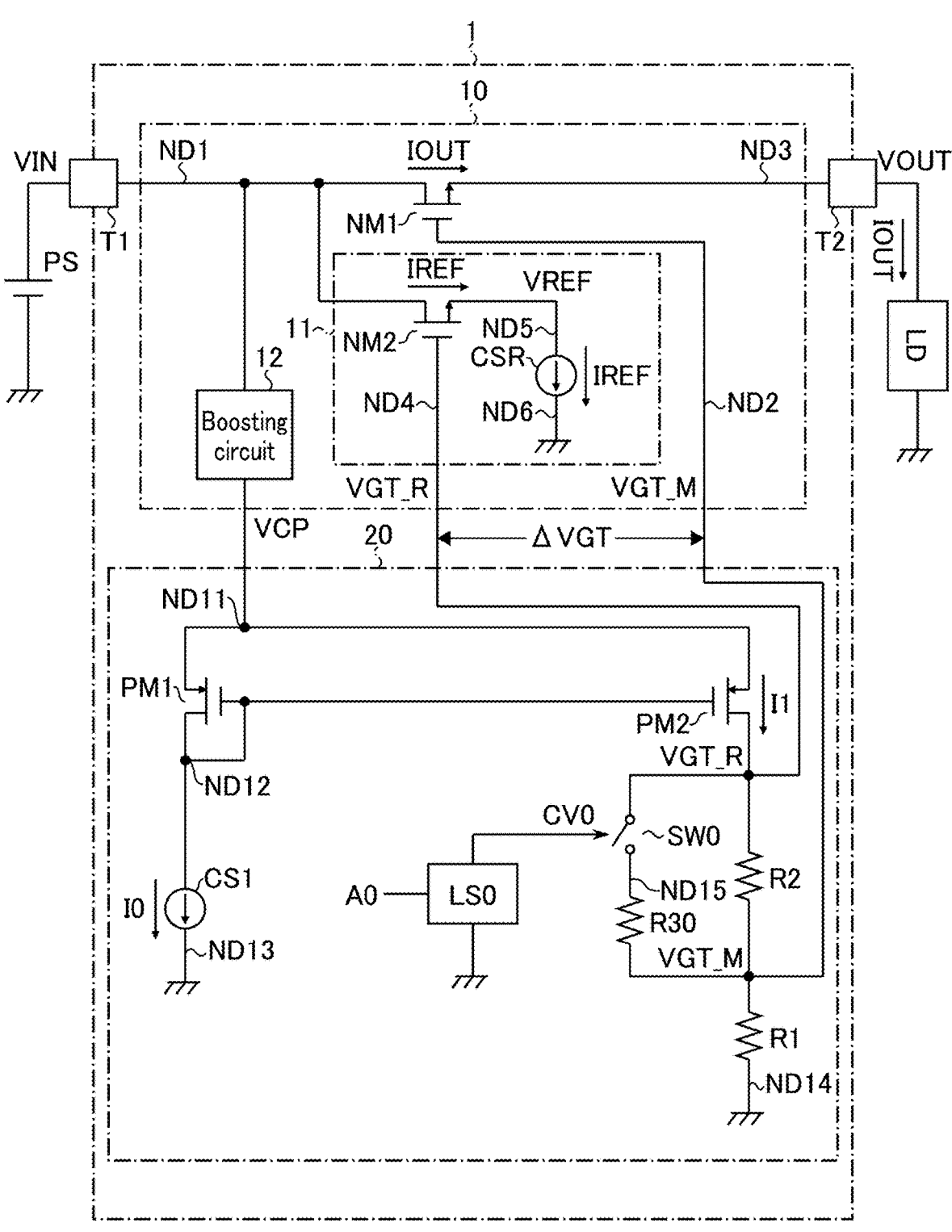
F I G. 1

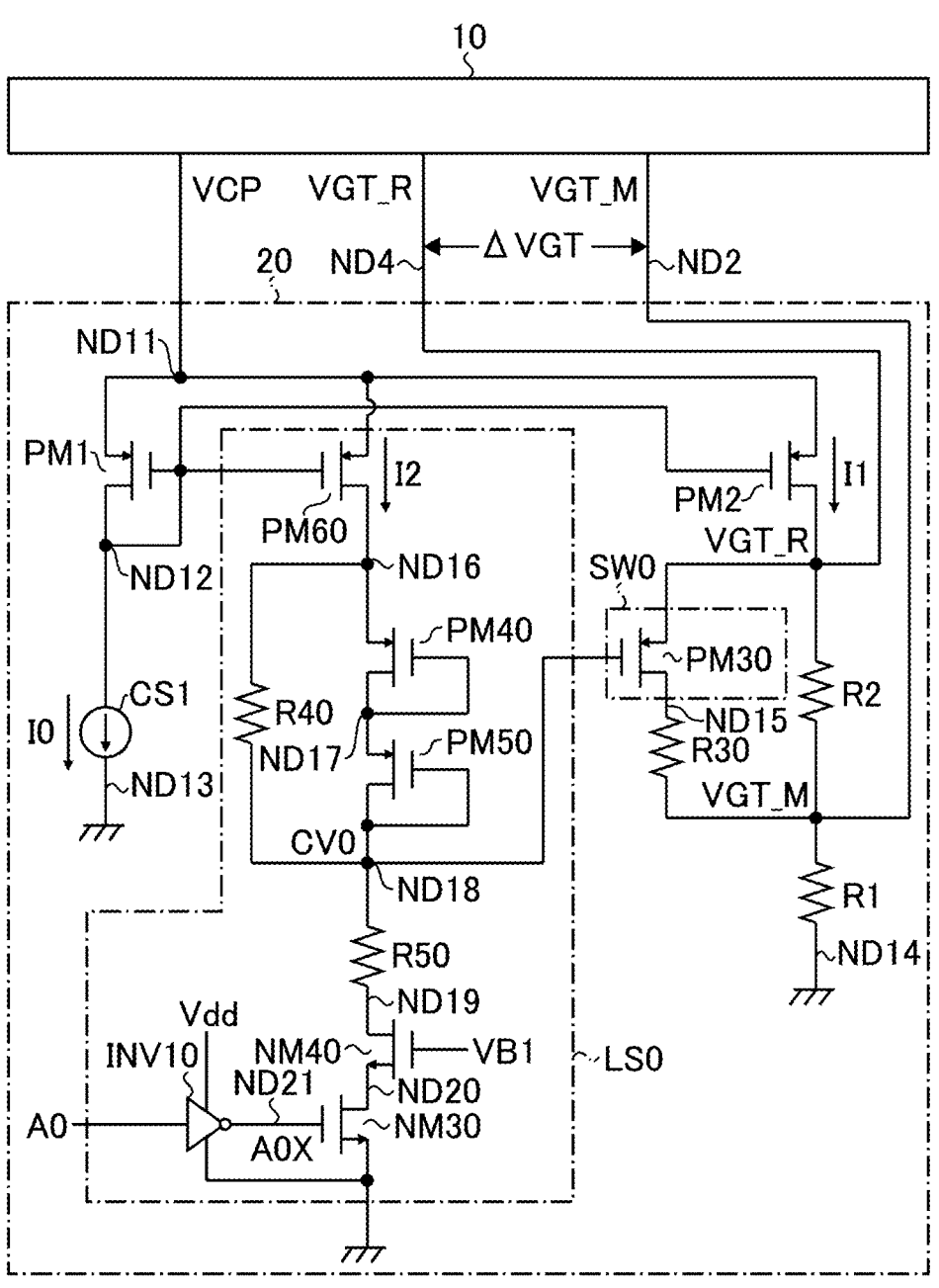
F I G. 2

| A0 | PM30 | $\triangle$ VGT |
|----|------|------|
| H | OFF | $I1 \times r2$ |
| L | ON | $I1 \times \dfrac{r30 \times r2}{r30 + r2}$ |

FIG. 3

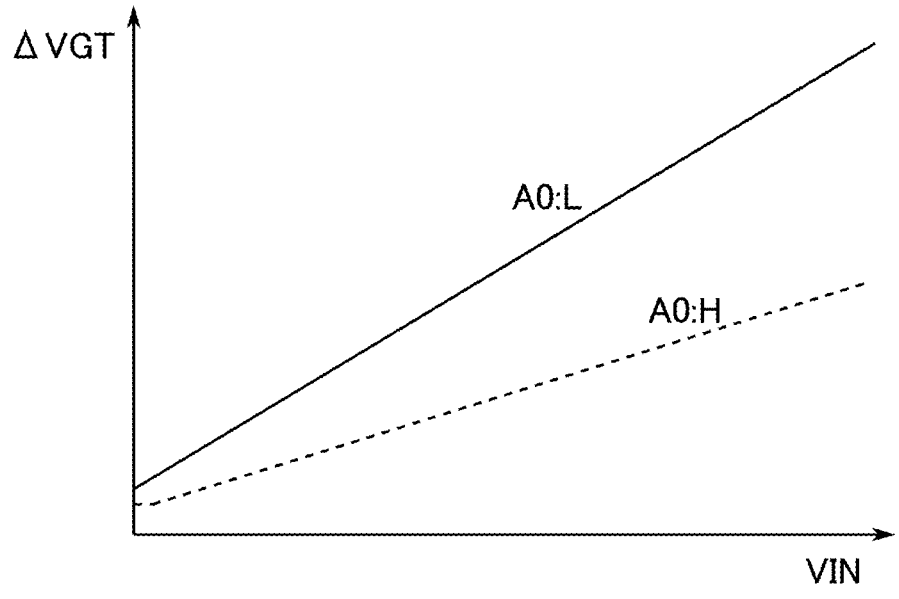
F I G. 4

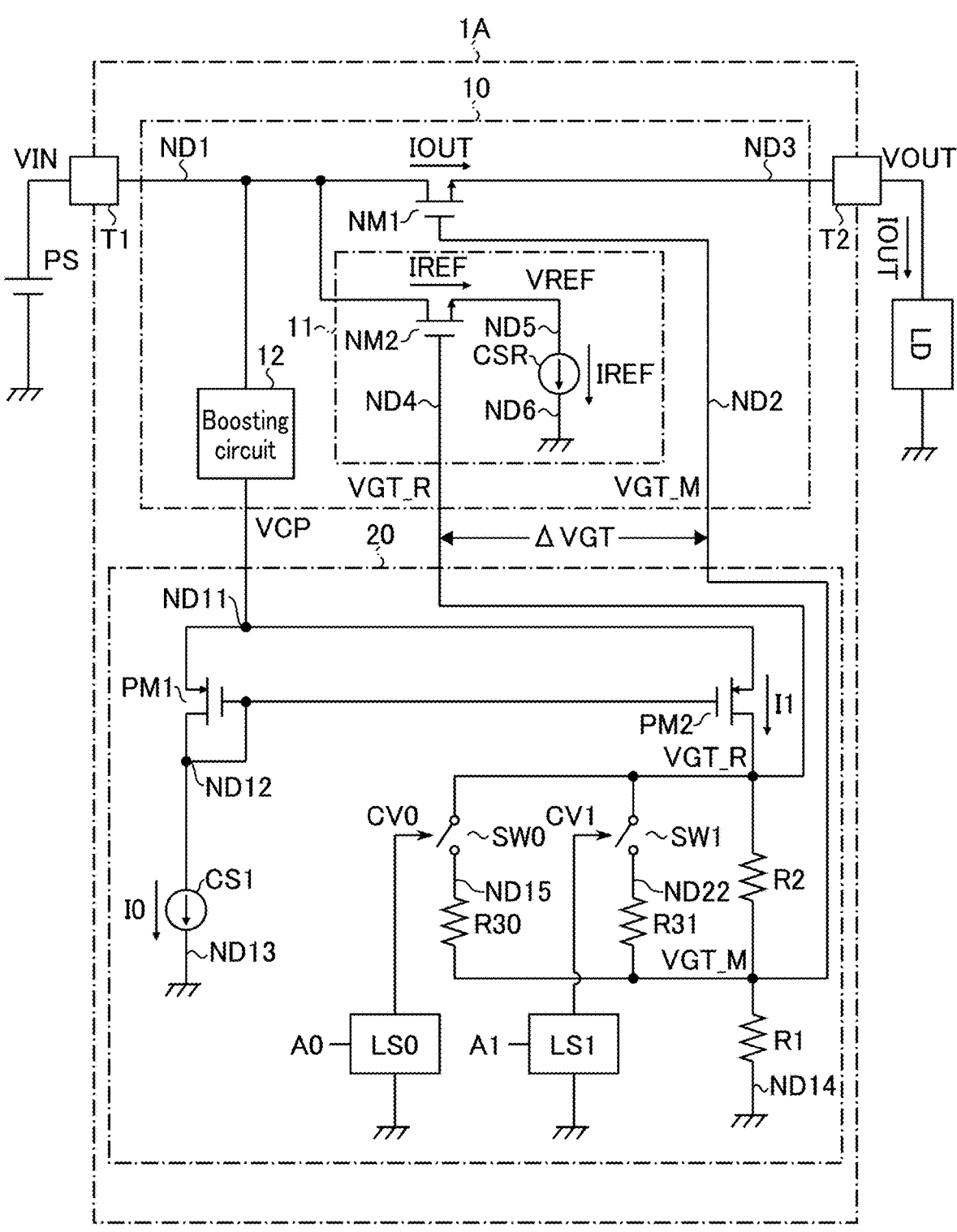
F I G. 5

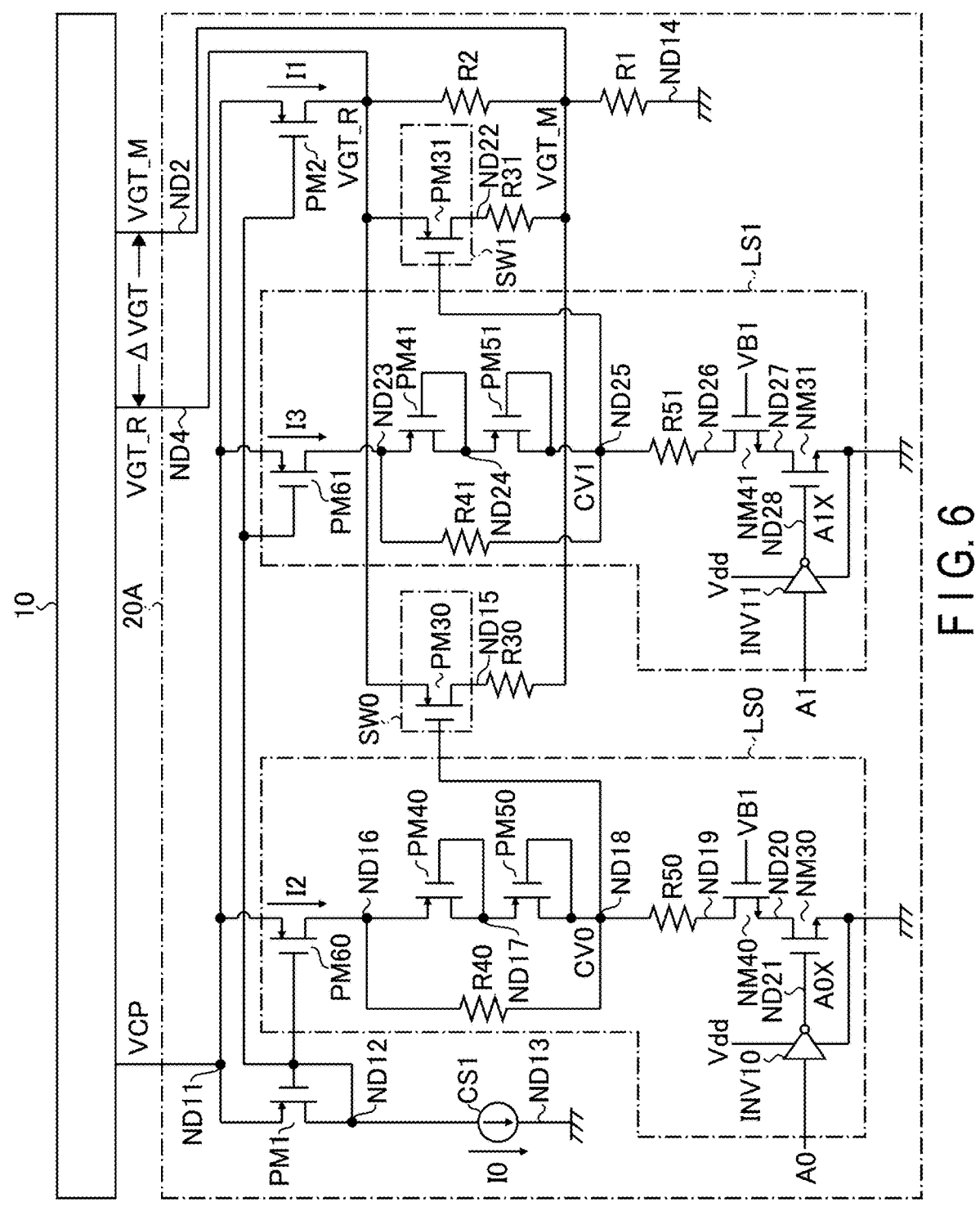
F I G. 6

| A1 | A0 | PM31 | PM30 | ΔVGT |
|----|----|----|----|----|
| H | H | OFF | OFF | $I1 \times r2$ |
| H | L | OFF | ON | $I1 \times \dfrac{r30 \times r2}{r30 + r2}$ |
| L | H | ON | OFF | $I1 \times \dfrac{r31 \times r2}{r31 + r2}$ |
| L | L | ON | ON | $I1 \times \dfrac{r31 \times r30 \times r2}{r31 \times r30 + r31 \times r2 + r30 \times r2}$ |

F I G. 7

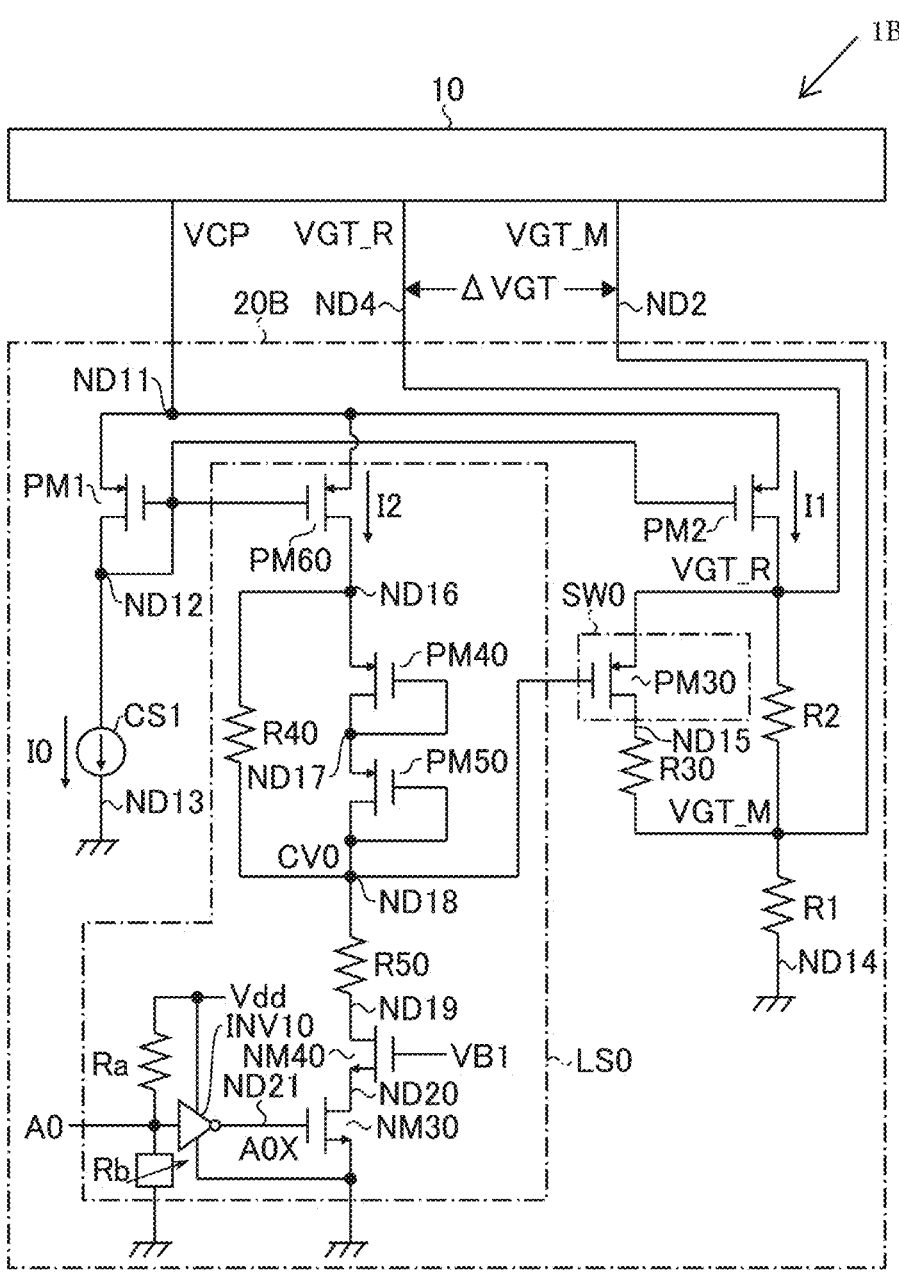
F I G. 8

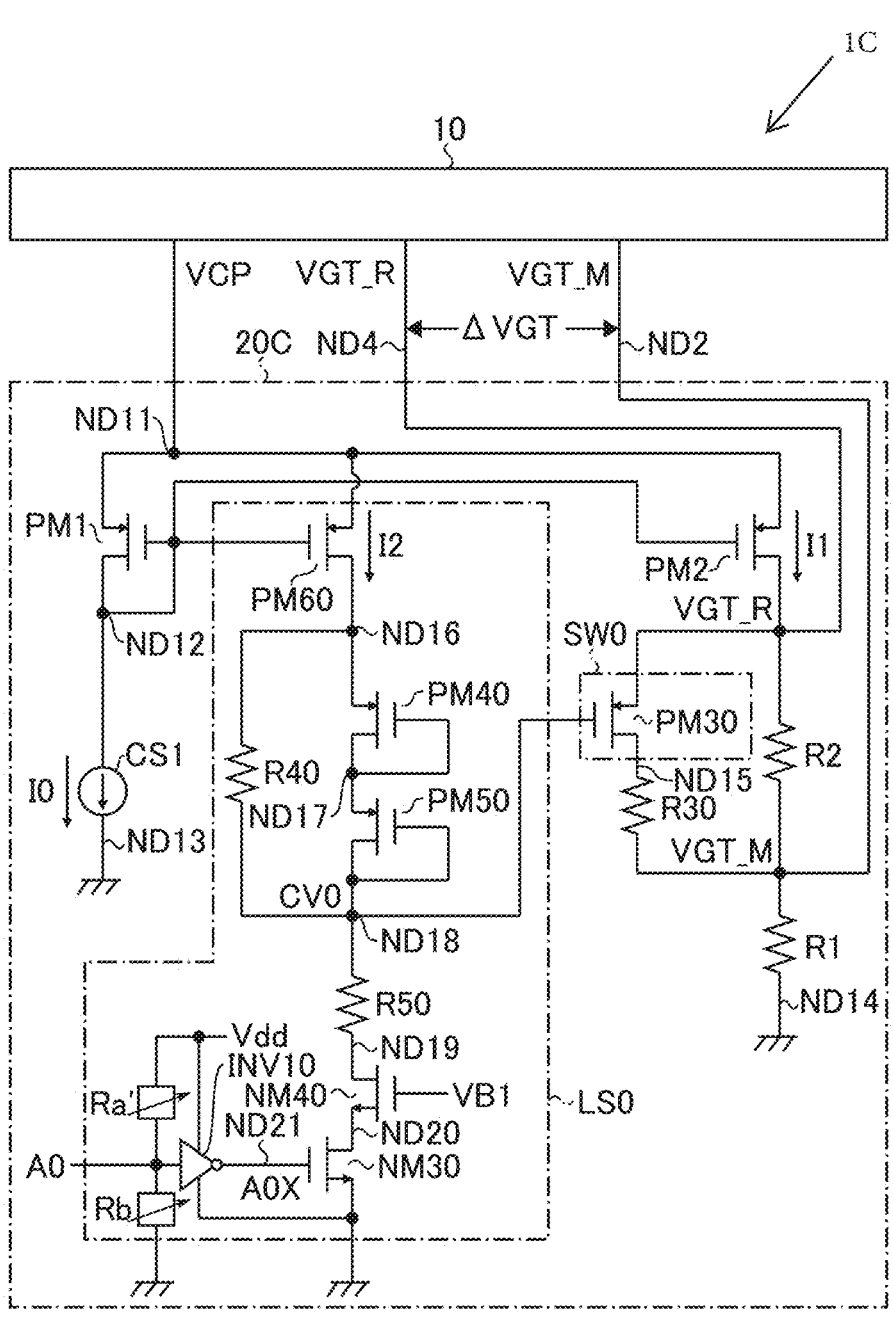
F I G. 9

SEMICONDUCTOR DEVICE

CROSS-REFERENCE TO RELATED APPLICATIONS

This application is based upon and claims the benefit of priority from Japanese Patent Application No. 2024-036065, filed Mar. 8, 2024, the entire contents of which are incorporated herein by reference.

FIELD

Embodiments described herein relate generally to a semiconductor device.

BACKGROUND

A semiconductor device configured to supply current to an external load is known.

BRIEF DESCRIPTION OF THE DRAWINGS

FIG. 1 is a circuit diagram showing an example of a circuit configuration of a semiconductor device according to a first embodiment.

FIG. 2 is a circuit diagram showing an example of a circuit configuration of an adjustment circuit included in the semiconductor device according to the first embodiment.

FIG. 3 is a diagram showing a relationship among an input voltage to a level shifter circuit, ON and OFF states of a transistor, and a gate voltage difference in the semiconductor device according to the first embodiment.

FIG. 4 is a diagram showing a relationship between an input voltage and a gate voltage difference in the semiconductor device according to the first embodiment.

FIG. 5 is a circuit diagram showing an example of a circuit configuration of a semiconductor device according to a second embodiment.

FIG. 6 is a circuit diagram showing an example of a circuit configuration of an adjustment circuit included in the semiconductor device according to the second embodiment.

FIG. 7 is a diagram showing a relationship among input voltages to two level shifter circuits, ON and OFF states of two transistors, and a gate voltage difference in the semiconductor device according to the second embodiment.

FIG. 8 is a circuit diagram showing an example of a circuit configuration of an adjustment circuit included in a semiconductor device according to a third embodiment.

FIG. 9 is a circuit diagram showing an example of a circuit configuration of an adjustment circuit included in a semiconductor device according to a fourth embodiment.

DETAILED DESCRIPTION

In general, according to one embodiment, a semiconductor device includes a first terminal, a second terminal, a first transistor, a first circuit, and a second circuit. One end of the first transistor is coupled to the first terminal. The other end of the first transistor is coupled to the second terminal. A gate of the first transistor is coupled to a first node. The first circuit includes a second transistor. One end of the second transistor is coupled to the first terminal. A gate of the second transistor is coupled to a second node. The first circuit monitors a first current flowing through the second transistor. The second circuit includes a first resistance element, a second resistance element, and a first switch element. One end of the first resistance element is coupled to the second node. The other end of the first resistance element is coupled to the first node. One end of the second resistance element is coupled to a third node. The other end of the second resistance element is coupled to the first node. The first switch element switches coupling and uncoupling between the second node and the third node. The second circuit adjusts a voltage difference between a gate voltage of the second transistor and a gate voltage of the first transistor by performing switching of the first switch element.

Hereinafter, embodiments will be described with reference to the accompanying drawings. The dimensions and ratios in the drawings are not always the same as the actual ones. In the following description, constituent elements having substantially the same function and configuration will be assigned the same reference symbol and repeat descriptions may be omitted. In the case where elements having similar configurations are distinguished from each other in particular, their identical reference symbols may be assigned different letters or numbers. All of the descriptions of an embodiment are applicable as descriptions of another embodiment, unless explicitly or self-evidently excluded.

1. First Embodiment

A semiconductor device according to a first embodiment will be described. Hereinafter, a semiconductor device including a transistor for controlling supply of a current to an external load and a monitor circuit configured to monitor, for overcurrent protection, a current flowing through the load will be described as an example. The semiconductor device according to the present embodiment is applied to an electric fuse inserted between an electric device and a power supply, for example.

1.1 Circuit Configuration of Semiconductor Device

A circuit configuration of the semiconductor device will be described with reference to FIG. 1. FIG. 1 is a circuit diagram showing an example of the circuit configuration of the semiconductor device. Hereinafter, in a case where a source and a drain of a transistor are not distinguished from each other, one of them will be referred to as "one end of a transistor" or "a first end of the transistor" and the other of them will be referred to as "the other end of the transistor" or "a second end of the transistor".

The semiconductor device 1 is, for example, an integrated circuit (IC) chip. As shown in FIG. 1, the semiconductor device 1 includes an input terminal T1, an output terminal T2, a drive circuit 10, and an adjustment circuit 20.

The input terminal T1 is coupled to an external power supply PS and the drive circuit 10. An input voltage VIN is input from the power supply PS to the input terminal T1. The voltage VIN is supplied to the drive circuit 10 via the input terminal T1. The voltage VIN is, for example, 12 V, 24 V, etc.

The output terminal T2 is coupled to the drive circuit 10 and an external load LD. The load LD represents, for example, an impedance of an electric device. A current IOUT is supplied from the drive circuit 10 to the output terminal T2. The current IOUT is supplied to the load LD via the output terminal T2. Furthermore, an output voltage VOUT is output from the output terminal T2 to the load LD.

The drive circuit 10 is a circuit configured to drive the load LD by supplying the current IOUT thereto. The drive circuit 10 has a function of monitoring the current IOUT flowing through the load LD and a function of boosting the voltage VIN.

The drive circuit 10 includes an n-channel MOS transistor NM1, a monitor circuit 11, and a boosting circuit 12.

One end of the transistor NM1 is coupled to a node ND1. The node ND1 is coupled to the input terminal T1. The other end of the transistor NM1 is coupled to a node ND3. The node ND3 is coupled to the output terminal T2. A gate of the transistor NM1 is coupled to a node ND2. The node ND2 is coupled to the adjustment circuit 20. The transistor NM1 functions as a switch (switch transistor) configured to drive the load LD. The transistor NM1 has a configuration in which, for example, N (where N is an integer equal to or greater than 1) n-channel MOS transistors nm are coupled in parallel. A value of N is, for example, 5000, 10000, 15000, etc. To decrease an ON resistance, a laterally double-diffused MOS (LDMOS) is used as the transistor NM1, for example.

The monitor circuit 11 is a circuit configured to monitor the current IOUT flowing through the load LD; to be more specific, a current (current IREF to be described later) based on the current IOUT. The monitor circuit 11 is coupled to the node ND1 and a node ND4. The node ND4 is coupled to the adjustment circuit 20. The monitor circuit 11 includes an n-channel MOS transistor NM2 and a current source CSR.

One end of the transistor NM2 is coupled to a node ND1. The other end of the transistor NM2 is coupled to a node ND5. The node ND5 is coupled to one end of the current source CSR. A voltage VREF is applied to the node ND5. A gate of the transistor NM2 is coupled to the node ND4. The transistor NM2 functions as a monitor transistor configured to monitor a current (current IREF) based on the current IOUT. The transistor NM2 is constituted of one n-channel MOS transistor nm (with the same structure as that of the n-channel MOS transistor nm of the transistor NM1), for example. Accordingly, the size of the transistor NM1 is N times the size of the transistor NM2. It can also be said that the gate width of the transistor NM1 is N times the gate width of the transistor NM2.

The transistors NM1 and NM2 are provided on a substrate, not shown.

The current source CSR supplies the current IREF from the node ND5 to a node ND6. One end of the current source CSR is coupled to the node ND5. The other end of the current source CSR is coupled to the node ND6. The node ND6 is grounded.

By the monitor circuit 11 monitoring the current IREF flowing through the transistor NM2, overcurrent can be suppressed by operating, for example, an overcurrent protection circuit, not shown, inside the semiconductor device 1. Specifically, when the current IOUT increases as the load LD drops excessively due to a breakdown of an electric device, etc., the voltage VOUT and the current IOUT are restricted to a certain value to protect the semiconductor device 1 and the electric device from a breakdown due to overcurrent.

Because the transistors NM1 and NM2 have the configurations described above, the current IREF is expressed as IREF=IOUT×(1/N). In a case where a value of N is equal to or greater than 2, the current IREF is smaller than the current IOUT, so that the power consumption of the monitor circuit 11 can be decreased.

The boosting circuit 12 is a circuit configured to boost the voltage VIN. The boosting circuit 12 is coupled to the node ND1 and a node ND11. The node ND11 is coupled to the adjustment circuit 20. The boosting circuit 12 is configured to boost the voltage VIN and output a boosted voltage VCP to the adjustment circuit 20. The boosting circuit 12 is provided to decrease ON resistances of the transistors NM1 and NM2 by increasing gate voltages of the transistors NM1 and NM2.

Even in a case where the transistors NM1 and NM2 include the n-channel MOS transistors nm having the same structures, a discrepancy in effective threshold voltage Vth may occur between the transistors NM1 and NM2 due to self-heating of the transistors NM1 and NM2. For this reason, the current IREF may not be proportional to the size of the transistors NM1 and NM2, that is, the current IREF may not be equal to the current IOUT×(1/N).

Therefore, in the present embodiment, a voltage difference is given between a gate voltage VGT_M (a voltage of the node ND2) of the transistor NM1 and a gate voltage VGT_R (a voltage of the node ND4) of the transistor NM2, and this voltage difference is adjusted such that the current IREF is proportional to the size of the transistors NM1 and NM2. By this, a discrepancy in effective threshold voltage Vth between the transistors NM1 and NM2 is corrected. Hereinafter, a voltage difference between the gate voltage VGT_M and the gate voltage VGT_R will be referred to as a "gate voltage difference ΔVGT". The adjustment of the gate voltage difference ΔVGT can be realized by utilizing a voltage drop due to a resistance, for example. The voltage VGT_M and the voltage VGT_R establish a relationship of VGT_R>VGT_M, for example.

The amount of discrepancy in effective threshold voltage Vth between the transistors NM1 and NM2 varies depending on the IC chip. In a case where a resistance element is provided between the nodes ND2 and ND4, the aforementioned resistance element also varies depending on the IC chip. Thus, the optimum value of the gate voltage difference ΔVGT also varies depending on the IC chip. Accordingly, the optimum value of the gate voltage difference ΔVGT is not always fixed. The optimum value of the gate voltage difference ΔVGT indicates a gate voltage difference in a case where the current IREF is equal to a current proportional to the size of the transistors NM1 and NM2.

Furthermore, in a case where a resistance element is provided between the nodes ND2 and ND4, the gate voltage difference ΔVGT is also adjustable by changing a current flowing through the aforementioned resistance element. However, in such a case, charging of the respective gates of the transistors NM1 and NM2 is affected. This affects a rising time of the voltage VOUT. Therefore, in the present embodiment, the gate voltage difference ΔVGT is adjusted while fixing a current flowing through the aforementioned resistance element.

The adjustment circuit 20 is a circuit configured to adjust the gate voltage difference ΔVGT. The adjustment circuit 20 includes a p-channel MOS transistor PM1, a current source CS1, a p-channel MOS transistor PM2, resistance elements R1 and R2, a switch element SW0, a resistance element R30, and a level shifter circuit LS0.

One end of the transistor PM1 is coupled to the node ND11. The other end of the transistor PM1 is coupled to a node ND12. A gate of the transistor PM1 is coupled to the node ND12.

The current source CS1 supplies a current IC from the node ND12 to a node ND13. One end of the current source CS1 is coupled to the node ND12. The other end of the current source CS1 is coupled to the node ND13. The node ND13 is grounded.

One end of the transistor PM2 is coupled to the node ND11. The other end of the transistor PM2 is coupled to the node ND4. A gate of the transistor PM2 is coupled to the node ND12.

The transistor PM1 and the transistor PM2 form a current mirror. In this manner, a current I1 according to a mirror ratio of the transistor PM1 to the transistor PM2 flows from the transistor PM2 to the node ND4.

One end of the resistance element R1 is coupled to the node ND2. The other end of the resistance element R1 is coupled to a node ND14. The node ND14 is grounded.

One end (a first end) of the resistance element R2 is coupled to the node ND4. The other end (a second end) of the resistance element R2 is coupled to the node ND2. Hereinafter, a resistance value of the resistance element R2 will be referred to as "r2".

The switch element SW0 is an element configured to switch coupling and uncoupling between the node ND4 and a node ND15 based on a control voltage CV0 supplied from the level shifter circuit LS0. One end of the switch element SW0 is coupled to the node ND4. The other end of the switch element SW0 is coupled to the node ND15.

One end (a first end) of the resistance element R30 is coupled to the node ND15. The other end (a second end) of the resistance element R30 is coupled to the node ND2. Hereinafter, a resistance value of the resistance element R30 will be referred to as "r30".

The level shifter circuit LS0 is a circuit configured to shift a voltage based on an input voltage A0. The level shifter circuit LS0 is grounded. In a case where the voltage VIN is relatively high, the switch element SW0 cannot be turned on and off. For this reason, the voltage A0 is shifted up by the level shifter circuit LS0. The voltage A0 is input to the level shifter circuit LS0. The voltage A0 is a voltage at a "Low" level (L level) or a voltage at a "High" level (H level). The voltage at the L level is, for example, 0 V. The voltage at the H level is a value which is, for example, higher than 0 V and does not exceed a breakdown voltage of an element that constitutes a logic circuit (not shown) inside the level shifter circuit LS0. The level shifter circuit LS0 outputs the voltage CV0 obtained by shifting up the voltage A0 to the switch element SW0. The voltage CV0 is a voltage that turns on the switch element SW0 or turns off the switch element SW0 with reference to the gate voltage VGT_R. The level shifter circuit LS0 will be described later in detail.

The adjustment circuit 20 performs switching of the switch element SW0 based on the voltage CV0. In this manner, the adjustment circuit 20 adjusts the gate voltage difference ΔVGT.

In a case where the switch element SW0 is in an ON state, a combined resistance rc between the node ND4 and the node ND2 is expressed as (r30×r2)/(r30+r2). In this case, the gate voltage difference ΔVGT is expressed as VGT_R−VGT_M=I1×((r30×r2)/(r30+r2)).

In a case where the switch element SW0 is in an OFF state, a combined resistance rc between the node ND4 and the node ND2 is r2. In this case, the gate voltage difference ΔVGT is expressed as VGT_R−VGT_M=I1×r2.

Because of (r30×r2)/(r30+r2)<r2, the gate voltage difference ΔVGT while the switch element SW0 is in the OFF state is greater than the gate voltage difference ΔVGT while the switch element SW0 is in the ON state. Therefore, the gate voltage difference ΔVGT may take two values. That is, the gate voltage difference ΔVGT can be changed at two stages by changing a value of the voltage A0.

1.2 Circuit Configuration of Adjustment Circuit

A circuit configuration of the adjustment circuit 20 will be described in detail with reference to FIG. 2. FIG. 2 is a circuit diagram showing an example of the circuit configuration of the adjustment circuit 20. FIG. 2 shows the drive circuit 10, too.

(Switch Element SW0)

The switch element SW0 is, for example, a p-channel MOS transistor PM30.

One end of the transistor PM30 is coupled to the node ND4. The other end of the transistor PM30 is coupled to the node ND15. A gate of the transistor PM30 is coupled to a node ND18. That is, the voltage CV0 is applied to the gate of the transistor PM30.

(Level Shifter Circuit LS0)

The level shifter circuit LS0 includes p-channel MOS transistors PM40 and PM50, a resistance element R40, a p-channel MOS transistor PM60, an inverter INV10, n-channel MOS transistors NM30 and NM40, and a resistance element R50.

One end of the transistor PM60 is coupled to a node ND11. The other end of the transistor PM60 is coupled to a node ND16. A gate of the transistor PM60 is coupled to a node ND12. The transistor PM60 functions as a current source.

The transistor PM1 and the transistor PM60 form a current mirror. In this manner, a current I2 according to a mirror ratio of the transistor PM1 to the transistor PM60 flows from the transistor PM60 to the node ND16.

One end of the transistor PM40 is coupled to the node ND16. The other end of the transistor PM40 is coupled to a node ND17. A gate of the transistor PM40 is coupled to the node ND17. The transistor PM40 functions as a diode. The transistor PM40 is provided for the purpose of adjustment of the voltage CV0 (a gate voltage of the transistor PM30).

One end of the transistor PM50 is coupled to the node ND17. The other end of the transistor PM50 is coupled to a node ND18. A gate of the transistor PM50 is coupled to the node ND18. The transistor PM50 functions as a diode. The transistor PM50 is provided for the purpose of adjustment of the voltage CV0.

One end of the resistance element R40 is coupled to the node ND16. The other end of the resistance element R40 is coupled to the node ND18. At power-on, in the case where the voltage VCP is low, the transistors PM40 and PM50 are in the OFF state. Accordingly, a gate voltage of the transistor PM30 (a voltage of the node ND18) attains a high impedance. In this case, the gate voltage is susceptible to noise. Furthermore, a gate voltage of the transistor PM30 easily becomes unstable. The resistance element R40 is provided to prevent a gate voltage of the transistor PM30 from attaining a high impedance while the transistors PM40 and PM50 are in the OFF state. That is, a bypass is given by inserting the resistance element R40.

A voltage Vdd and a ground voltage GND are applied to the inverter INV10. The voltage Vdd is a voltage generated by a regulator (not shown) inside the semiconductor device 1 based on the voltage VIN, for example. The voltage Vdd is, for example, 3 V. The voltage A0 is applied to an input terminal of the inverter INV10. An output terminal of the inverter INV10 is coupled to a node ND21. A voltage AOX obtained by inverting a voltage level of the voltage A0 is output from the output terminal of the inverter INV10 to the node ND21.

One end of the transistor NM30 is grounded. The other end of the transistor NM30 is coupled to a node ND20. A gate of the transistor NM30 is coupled to the node ND21. The transistor NM30 is designed such that its ON and OFF states are switched depending on the voltage AOX.

The level shifter circuit LS0 controls the transistor NM30 based on the voltage A0, thereby shifting the voltage A0 up to the voltage CV0.

One end of the transistor NM40 is coupled to a node ND19. The other end of the transistor NM40 is coupled to the node ND20. A voltage VB1 is applied to a gate of the transistor NM40. The voltage VB1 is a voltage that always turns on the transistor NM40. The transistor NM40 is a high breakdown voltage transistor. The transistor NM40 is inserted such that the level shifter circuit LS0 is not broken by a voltage being applied between the drain and source even in a case where the voltage VCP is relatively high. For example, by the source of the transistor NM40 being coupled to the drain of the transistor NM30, a drain voltage of the transistor NM30 is prevented from increasing.

One end of the resistance element R50 is coupled to the node ND18. The other end of the resistance element R50 is coupled to the node ND19. The resistance element R50 is provided for the purpose of adjustment of the voltage CV0.

FIG. 3 is a diagram showing a relationship among the input voltage A0 to the level shifter circuit LS0, the ON and OFF states of the transistor PM30, and the gate voltage difference ΔVGT.

In a case where the voltage A0 is at the H level (for example, Vdd), the voltage AOX is at the L level, and the transistor NM30 is turned off. The transistor NM40 is in the ON state. At this time, an impedance at a side below the node ND18 is high, whereas an impedance at a side above the node ND18 is maintained to be relatively low due to the presence of the resistance element R40. In this manner, a voltage (CV0) of the node ND18 increases up to a voltage equal to that of a drain of the transistor PM60. Thus, the transistor PM30 is turned off. At this time, a combined resistance rc between the node ND4 and the node ND2 is r2. In this case, the gate voltage difference ΔVGT is expressed as I1×r2.

In a case where the voltage A0 is at the L level (for example, 0 V), the voltage AOX is at the H level, and the transistor NM30 is turned on. The transistor NM40 is in the ON state. At this time, an impedance at the side below the node ND18 is low. This decreases a voltage of the node ND18. Because the transistors PM40 and PM50 having the threshold value Vth are provided, a voltage (CV0) of the node ND18 decreases down to a value which is lower by one threshold value Vth of the transistor PM30. Thus, the transistor PM30 is turned on. At this time, the combined resistance rc between the node ND4 and the node ND2 is expressed as (r30×r2)/(r30+r2). In this case, the gate voltage difference ΔVGT is expressed as I1×((r30×r2)/(r30+r2)). A resistance value r30 is considered to be a value including an ON resistance of the transistor PM30.

The voltage A0 is supplied from the outside of the semiconductor device 1, for example, in a test before shipment of a product. That is, the voltage A0 is set to the L level or the H level in the test. Meanwhile, the voltage A0 may be set to the L level or the H level by a user after shipment of a product.

FIG. 4 is a diagram showing a relationship between the input voltage VIN and the gate voltage difference ΔVGT. The vertical axis represents the gate voltage difference ΔVGT. The horizontal axis represents the input voltage VIN. The solid line indicates a case in which the voltage A0 is at the L level, and the dashed line indicates a case in which the voltage A0 is at the H level. As shown in FIG. 4, the gate voltage difference ΔVGT in a case of the voltage A0 at the L level is larger than that in a case of the voltage A0 at the H level.

1.3 Advantageous Effect of Present Embodiment

As described above, the semiconductor device 1 according to the present embodiment includes an input terminal T1, an output terminal T2, a transistor NM1, a monitor circuit 11, and an adjustment circuit 20. The monitor circuit 11 includes a transistor NM2. The adjustment circuit 20 includes a resistance element R2 and R30 and the switch element SW0. The adjustment circuit 20 adjusts the gate voltage difference ΔVGT between the gate voltage VGT_R of the transistor NM2 and the gate voltage VGT_M of the transistor NM1 by performing switching of the switch element SW0. In this manner, the gate voltage difference ΔVGT can be adjusted at two stages including one case in which the switch element SW0 is in the ON state and the other case in which the switch element SW0 is in the OFF state. This absorbs variations in the resistance elements R2 and the amount of discrepancy between the transistors NM1 and NM2, so that the gate voltage difference ΔVGT can be brought close to the optimum value as compared to a case in which the gate voltage difference ΔVGT is adjusted at one stage. Thus, according to the present embodiment, the yield of the semiconductor device 1 can be improved.

Furthermore, as described above, the adjustment circuit 20 includes the level shifter circuit LS0. The level shifter circuit LS0 shifts the voltage A0 up to the voltage CV0. As the voltage A0, either a voltage at the L level or a voltage at the H level is supplied from the outside of the semiconductor device 1. By this, the voltage CV0 becomes a voltage at the L level or the H level. This enables the adjustment circuit 20 to perform switching of the switch element SW0 based on the voltage CV0. Therefore, according to the present embodiment, variations in the resistance elements R2 and the amount of discrepancy between the transistors NM1 and NM2 can be trimmed using the voltage A0 supplied from the outside of the semiconductor device 1.

2. Second Embodiment

A semiconductor device according to a second embodiment will be described. A semiconductor device 1A according to the second embodiment differs from that of the first embodiment in that an adjustment circuit 20A includes a switch element SW1, a resistance element R31, and a level shifter circuit LS1. The following description will concentrate on the features different from the first embodiment.

2.1 Circuit Configuration of Semiconductor Device

A circuit configuration of the semiconductor device 1A will be described with reference to FIG. 5. FIG. 5 is a circuit diagram showing an example of the circuit configuration of the semiconductor device 1A.

A configuration of the drive circuit 10 is similar to that of FIG. 1 described in the first embodiment.

The adjustment circuit 20A includes, in addition to the constituent elements of FIG. 1 described in the first embodiment, the switch element SW1, the resistance element R31, and the level shifter circuit LS1. That is, the adjustment circuit 20A includes two sets of elements including a switch element, a resistance element, and a level shifter circuit. The number of sets of elements including a switch element, a resistance element, and a level shifter circuit may be three or more.

The switch element SW1 is an element configured to switch coupling and uncoupling between the node ND4 and a node ND22 based on a control voltage CV1 supplied from the level shifter circuit LS1. The switch element SW1 has a similar configuration to that of the switch element SW0. One end of the switch element SW1 is coupled to the node ND4. The other end of the switch element SW1 is coupled to the node ND22.

One end (a first end) of the resistance element R31 is coupled to the node ND22. The other end (a second end) of the resistance element R31 is coupled to the node ND2. Hereinafter, a resistance value of the resistance element R31 will be referred to as "r31". The resistance value r31 of the resistance element R31 differs from the resistance value r30 of the resistance element R30. The resistance value r31 of the resistance element R31 may be equal to the resistance value r30 of the resistance element R30.

The level shifter circuit LS1 is a circuit configured to shift a voltage based on an input voltage A1. The level shifter circuit LS1 has a similar configuration to that of the level shifter circuit LS0. The circuit LS1 is grounded. The voltage A1 is input to the level shifter circuit LS1. The voltage A1 is a voltage at the L level or a voltage at the H level. The voltage at the L level is, for example, 0 V. The voltage at the H level is a value which is, for example, higher than 0 V and does not exceed a breakdown voltage of an element that constitutes a logic circuit (not shown) inside the level shifter circuit LS1. The level shifter circuit LS1 outputs the voltage CV1 obtained by shifting the voltage A1 up to the switch element SW1. The voltage CV1 is a voltage that turns on the switch element SW1 or turns off the switch element SW1 with reference to the gate voltage VGT_R. The level shifter circuit LS1 will be described later in detail.

The adjustment circuit 20A further performs, in addition to switching of the switch element SW0 based on the voltage CV0, switching of the switch element SW1 based on the voltage CV1. In this manner, the adjustment circuit 20A adjusts the gate voltage difference ΔVGT.

In a case where the switch element SW1 is in the ON state and the switch element SW0 is in the ON state, the combined resistance rc between the node ND4 and the node ND2 is expressed as $(r31 \times r30 \times r2)/(r31 \times r30 + r31 \times r2 + r30 \times r2)$. In this case, the gate voltage difference ΔVGT is expressed as $VGT\_R - VGT\_M = I1 \times ((r31 \times r30 \times r2)/(r31 \times r30 + r31 \times r2 + r30 \times r2))$.

In a case where the switch element SW1 is in the ON state and the switch element SW0 is in the OFF state, the combined resistance rc between the node ND4 and the node ND2 is expressed as $(r31 \times r2)/(r31 + r2)$. In this case, the gate voltage difference ΔVGT is expressed as $VGT\_R - VGT\_M = I1 \times ((r31 \times r2)/(r31 + r2))$.

In a case where the switch element SW1 is in the OFF state and the switch element SW0 is in the ON state, the combined resistance rc between the node ND4 and the node ND2 is expressed as $(r30 \times r2)/(r30 + r2)$. In this case, the gate voltage difference ΔVGT is expressed as $VGT\_R - VGT\_M = I1 \times ((r30 \times r2)/(r30 + r2))$.

In a case where the switch element SW1 is in the OFF state and the switch element SW0 is in the OFF state, the combined resistance rc between the node ND4 and the node ND2 is expressed as r2. In this case, the gate voltage difference ΔVGT is expressed as $VGT\_R - VGT\_M = I1 \times r2$.

Since r31 is different from r30, the gate voltage difference ΔVGT may take four values. That is, the gate voltage difference ΔVGT can be changed at four stages by changing values of the voltages A0 and A1.

2.2 Circuit Configuration of Adjustment Circuit

A circuit configuration of the adjustment circuit 20A will be described in detail with reference to FIG. 6. FIG. 6 is a circuit diagram showing an example of the circuit configuration of the adjustment circuit 20A. FIG. 6 shows the drive circuit 10, too.

(Switch Element SW1)

The switch element SW1 is, for example, a p-channel MOS transistor PM31.

The transistor PM31 has a similar configuration to that of the transistor PM30. One end of the transistor PM31 is coupled to the node ND4. The other end of the transistor PM31 is coupled to the node ND22. A gate of the transistor PM31 is coupled to a node ND25. That is, the voltage CV1 is applied to the gate of the transistor PM31.

(Level Shifter Circuit LS1)

The level shifter circuit LS1 includes p-channel MOS transistors PM41 and PM51, a resistance element R41, a p-channel MOS transistor PM61, an inverter INV11, n-channel MOS transistors NM31 and NM41, and a resistance element R51.

The transistor PM61 has a similar configuration to that of the transistor PM60. One end of the transistor PM61 is coupled to the node ND11. The other end of the transistor PM61 is coupled to a node ND23. A gate of the transistor PM61 is coupled to the node ND12.

The transistor PM1 and the transistor PM61 form a current mirror. In this manner, a current I3 according to a mirror ratio of the transistor PM1 to the transistor PM61 flows from the transistor PM61 to the node ND23.

The transistor PM41 has a similar configuration to that of the transistor PM40. One end of the transistor PM41 is coupled to the node ND23. The other end of the transistor PM41 is coupled to a node ND24. A gate of the transistor PM41 is coupled to the node ND24.

The transistor PM51 has a similar configuration to that of the transistor PM50. One end of the transistor PM51 is coupled to the node ND24. The other end of the transistor PM51 is coupled to the node ND25. A gate of the transistor PM51 is coupled to the node ND25.

One end of the resistance element R41 is coupled to the node ND23. The other end of the resistance element R41 is coupled to the node ND25. A resistance value of the resistance element R41 is equal to, for example, a resistance value of the resistance element R40.

An inverter INV11 has a similar configuration to that of the inverter INV10. The voltage Vdd and the ground voltage GND are applied to the inverter INV11. The voltage A1 is applied to an input terminal of the inverter INV11. An output terminal of the inverter INV11 is coupled to a node ND28. A voltage A1X obtained by inverting a voltage level of the voltage A1 is output from the output terminal of the inverter INV11 to the node ND28.

The transistor NM31 has a similar configuration to that of the transistor NM30. One end of the transistor NM31 is grounded. The other end of the transistor NM31 is coupled to a node ND27. A gate of the transistor NM31 is coupled to the node ND28. The transistor NM31 is designed such that its ON and OFF states are switched depending on the voltage A1X.

The level shifter circuit LS1 controls the transistor NM31 based on the voltage A1, thereby shifting the voltage A1 up to the voltage CV1.

The transistor NM41 has a similar configuration to that of the transistor NM40. One end of the transistor NM41 is coupled to a node ND26. The other end of the transistor NM41 is coupled to the node ND27. A voltage VB1 is applied to a gate of the transistor NM41. The voltage VB1 is a voltage that always turns on the transistor NM41. The transistor NM41 is a high breakdown voltage transistor.

One end of the resistance element R51 is coupled to the node ND25. The other end of the resistance element R51 is coupled to the node ND26. A resistance value of the resistance element R51 is equal to, for example, a resistance value of the resistance element R50.

The rest of the configuration inside the adjustment circuit 20A is similar to that of FIG. 2 described in the first embodiment.

FIG. 7 is a diagram showing a relationship among the input voltage A1 to the level shifter circuit LS1, the input voltage A0 to the level shifter circuit LS0, the ON and OFF states of the transistor PM31, the ON and OFF states of the transistor PM30, and the gate voltage difference ΔVGT.

In a case where the voltage A0 is at the H level (for example, Vdd), the transistor PM30 is turned off, as described in the first embodiment. In a case where the voltage A1 is at the H level (for example Vdd), the transistor PM31 is turned off as with the transistor PM30.

In a case where the voltage A0 is at the L level (for example, 0 V), the transistor PM30 is turned on as described in the first embodiment. In a case where the voltage A1 is at the L level (for example, 0 V), the transistor PM31 is turned on as with the transistor PM30.

In a case where the voltage A1 is at the H level and the voltage A0 is at the H level, the transistors PM30 and PM31 are turned off. At this time, a combined resistance rc between the node ND4 and the node ND2 is r2. In this case, the gate voltage difference ΔVGT is expressed as I1×r2.

In a case where the voltage A1 is at the H level and the voltage A0 is at the L level, the transistor PM31 is turned off. The transistor PM30 is turned on. At this time, the combined resistance rc between the node ND4 and the node ND2 is expressed as (r30×r2)/(r30+r2). In this case, the gate voltage difference ΔVGT is expressed as I1×((r30×r2)/(r30+r2)).

In a case where the voltage A1 is at the L level and the voltage A0 is at the H level, the transistor PM31 is turned on. The transistor PM30 is turned off. At this time, the combined resistance rc between the node ND4 and the node ND2 is expressed as (r31×r2)/(r31+r2). In this case, the gate voltage difference ΔVGT is expressed as I1×((r31×r2)/(r31+r2)).

In a case where the voltage A1 is at the L level and the voltage A0 is at the L level, the transistors PM30 and PM31 are turned on. At this time, a combined resistance rc between the node ND4 and the node ND2 is expressed as (r31×r30× r2)/(r31×r30+r31×r2+r30×r2). In this case, the gate voltage difference ΔVGT is expressed as I1×((r31×r30×r2)/(r31× r30+r31×r2+r30×r2)).

The voltages A0 and A1 are supplied from the outside of the semiconductor device 1A, for example, in a test before shipment of a product. That is, the voltages A0 and A1 are set to the L level or the H level in the test. Meanwhile, the voltages A0 and A1 may be set to the L level or the H level by a user after shipment of a product.

2.3 Advantageous Effect of Present Embodiment

As described above, the semiconductor device 1A according to the present embodiment includes the input terminal T1, the output terminal T2, the transistor NM1, the monitor circuit 11, and the adjustment circuit 20A. The monitor circuit 11 includes a transistor NM2. The adjustment circuit 20A includes the resistance elements R2, R30, and R31 and the switch elements SW0 and SW1. The adjustment circuit 20A adjusts the gate voltage difference ΔVGT by performing switching of the switch element SW1 in addition to switching of the switch element SW0. In this manner, the gate voltage difference ΔVGT can be adjusted at four stages.

This absorbs variations in the resistance element R2 and the amount of discrepancy between the transistors NM1 and NM2, so that the gate voltage difference ΔVGT can be brought even closer to the optimum value as compared to a case in which the gate voltage difference ΔVGT is adjusted at two stages. Thus, according to the present embodiment, the yield of the semiconductor device 1A can be improved.

In a case of three or more sets of elements including the switch element, the resistance element, and the level shifter circuit, the gate voltage difference ΔVGT can be brought even closer to the optimum value as compared to the case in which the adjustment is made at four stages.

Furthermore, as described above, the adjustment circuit 20A includes the level shifter circuit LS0 and LS1. The level shifter circuit LS0 shifts the voltage A0 up to the voltage CV0. The level shifter circuit LS1 shifts the voltage A1 up to the voltage CV1. As the voltages A0 and A1, either a voltage at the L level or a voltage at the H level is supplied from the outside of the semiconductor device 1A. Therefore, the adjustment circuit 20A can perform switching of the switch element SW1 based on the voltage CV1 in addition to switching of the switch element SW0 based on the voltage CV0. Therefore, according to the present embodiment, variations in the resistance element R2 and the amount of discrepancy between the transistors NM1 and NM2 can be trimmed using the voltage A0 and A1 supplied from the outside of the semiconductor device 1A.

3. Third Embodiment

A semiconductor device according to a third embodiment will be described. A semiconductor device 1B according to the third embodiment differs from that of the first embodiment in that a voltage A0 is generated inside the level shifter circuit LS0. The following description will concentrate on the features different from the first embodiment.

3.1 Circuit Configuration of Adjustment Circuit

A circuit configuration of an adjustment circuit 20B will be described in detail with reference to FIG. 8. FIG. 8 is a circuit diagram showing an example of the circuit configuration of the adjustment circuit 20B.
(Level Shifter Circuit LS0)

The level shifter circuit LS0 includes a resistance element Ra and a fuse resistance element Rb in addition to the constituent elements shown in FIG. 2.

The voltage Vdd is applied to one end (a first end) of the resistance element Ra. The other end (a second end) of the resistance element Ra is coupled to the input terminal of the inverter INV10. Hereinafter, a resistance value of the resistance element Ra will be referred to as "ra".

One end (a first end) of the fuse resistance element Rb is coupled to the input terminal of the inverter INV10. The other end (a second end) of the fuse resistance element Rb is grounded. Hereinafter, a resistance value of the fuse resistance element Rb will be referred to as "rb".

The rest of the configuration inside the adjustment circuit 20B is similar to that of FIG. 2 described in the first embodiment.

The voltage A0 is expressed below by Equation (1), for example.

$$A0 = Vdd \times (rb/(ra + rb)) \tag{1}$$

Herein, for example, the voltage Vdd is 1.8 V. The resistance value ra of the resistance element Ra is 10 kΩ. The resistance value rb of the fuse resistance element Rb is 100Ω before the fuse is cut and is 100 kΩ after the fuse is cut. According to Equation (1) above, the voltage A0 is about 0 V (L-level voltage) before the fuse is cut and is about 1.64 V (H-level voltage) after the fuse is cut. For example, in a case where the threshold voltage Vth of the transistor NM30 is about 0.9 V, the transistor NM30 is turned on before the fuse is cut and is turned off after the fuse is cut.

The voltage A0 is set to the L level or the H level depending on whether the fuse is cut or not inside the level shifter circuit LS0, for example, in a test before shipment of a product. As described above, the voltage A0 is generated inside the semiconductor device 1B.

The fuse resistance element Rb may not be an element which increases in resistance value rb before and after the fuse is cut, and may be an element which decreases in resistance value rb before and after the fuse is cut. In such a case, the transistor NM30 is turned off before the fuse is cut and is turned on after the fuse is cut.

3.2 Advantageous Effects of Present Embodiment

The present embodiment produces advantageous effects similar to those of the first embodiment.

Furthermore, as described above, the level shifter circuit LS0 includes the resistance element Ra and the fuse resistance element Rb. The voltage A0 becomes one of the two types of voltages including one type of voltage in a case in which the fuse resistance element Rb is cut and the other type of voltage in a case in which the fuse resistance element Rb is not cut. By this, the voltage CV0 becomes a voltage at the L level or the H level. This enables the adjustment circuit 20B to perform switching of the switch element SW0 based on the voltage CV0. Therefore, according to the present embodiment, variations in the resistance element R2 and the amount of discrepancy between the transistors NM1 and NM2 can be trimmed using the voltage A0 generated inside the semiconductor device 1B.

As a matter of course, the present embodiment is applicable to the semiconductor device 1A according to the second embodiment.

4. Fourth Embodiment

A semiconductor device according to a fourth embodiment will be described. A semiconductor device 1C according to the fourth embodiment differs from that of the third embodiment in that the resistance element Ra inside the level shifter circuit LS0 is replaced with a fuse resistance element Ra'. The following description will concentrate on the features different from the third embodiment.

4.1 Circuit Configuration of Adjustment Circuit

A circuit configuration of the adjustment circuit 20C will be described in detail with reference to FIG. 9. FIG. 9 is a circuit diagram showing an example of the circuit configuration of the adjustment circuit 20C.
(Level Shifter Circuit LS0)

The level shifter circuit LS0 includes the fuse resistance elements Ra' and Rb in addition to the constituent elements shown in FIG. 2.

The voltage Vdd is applied to one end (a first end) of the fuse resistance element Ra'. The other end (a second end) of the fuse resistance element Ra' is coupled to the input terminal of the inverter INV10. Hereinafter, a resistance value of the fuse resistance element Ra' will be referred to as "ra'".

The rest of the configuration inside the adjustment circuit 20C is similar to that of FIG. 8 described in the third embodiment.

The voltages A0 is expressed below by Equation (2), for example.

$$A0 = Vdd \times (rb/(ra' + rb)) \qquad (2)$$

Herein, for example, the voltage Vdd is 1.8 V. The resistance value ra' of the fuse resistance element Ra' is 100Ω before the fuse is cut and is 100 kΩ after the fuse is cut. The resistance value rb of the fuse resistance element Rb is 100Ω before the fuse is cut and is 100 kΩ after the fuse is cut. Furthermore, the fuse of one of the fuse resistance elements Ra' and Rb is to be cut. According to Equation (2) above, the voltage A0 is 0.9 V before the fuse is cut. In a case where the fuse resistance element Ra' is cut, the voltage A0 is about 0 V after the fuse is cut. In such a case, the transistor NM30 is turned off before the fuse is cut and is turned on after the fuse is cut. In a case where the fuse resistance element Rb is cut, the voltage A0 is about 1.64 V after the fuse is cut. In such a case, the transistor NM30 is turned on before the fuse is cut and is turned off after the fuse is cut.

The voltage A0 is set to the L level or the H level depending on whether the fuse resistance element Ra' is cut or not and whether the fuse resistance element Rb is cut or not inside the level shifter circuit LS0, for example, in a test before shipment of a product. As described above, the voltage A0 is generated inside the semiconductor device 1C.

4.2. Advantageous Effects of Present Embodiment

The present embodiment produces advantageous effects similar to those of the third embodiment. As a matter of course, the present embodiment is applicable to the semiconductor device 1A according to the second embodiment.

5. Modifications, Etc

As described above, a semiconductor device (1) according to an embodiment includes a first terminal (T1), a second terminal (T2), a first transistor (NM1), a first circuit (11), and a second circuit (20). One end of the first transistor (NM1) is coupled to the first terminal (T1). The other end of the first transistor (NM1) is coupled to the second terminal (T2). A gate of the first transistor (NM1) is coupled to a first node (ND2). The first circuit (11) includes a second transistor (NM2). One end of the second transistor (NM2) is coupled to the first terminal (T1). A gate of the second transistor (NM2) is coupled to a second node (ND4). The first circuit (11) monitors a first current (IREF) flowing through the second transistor (NM2). The second circuit (20) includes a first resistance element (R2), a second resistance element (R30), and a first switch element (SW0). One end of the first resistance element (R2) is coupled to the second node (ND4). The other end of the first resistance element (R2) is coupled to the first node (ND2). One end of the second resistance element (R30) is coupled to a third node (ND15). The other end of the second resistance element (R30) is coupled to the first node (ND2). The first switch element (SW0) switches coupling and uncoupling between the second node (ND4) and the third node (ND15). The second circuit (20) adjusts a voltage difference (ΔVGT) between a gate voltage (VGT_R) of the second transistor (M42) and a gate voltage (VGT_M) of the first transistor (NM1) by performing switching of the first switch element (SW0).

The embodiments are not limited to those described in the above, and various modifications can be made.

Throughout the specification, the expression "coupling" refers to electrical coupling and does not exclude, for example, interposition of another element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a first terminal;
a second terminal;
a first transistor, a first end of the first transistor being coupled to the first terminal, a second end of the first transistor being coupled to the second terminal, a gate of the first transistor being coupled to a first node;
a first circuit including a second transistor, a first end of the second transistor being coupled to the first terminal, a gate of the second transistor being coupled to a second node, the first circuit being configured to monitor a first current flowing through the second transistor; and
a second circuit including:
a first resistance element, a first end of the first resistance element being coupled to the second node, a second end of the first resistance element being coupled to the first node;
a second resistance element, a first end of the second resistance element being coupled to a third node, a second end of the second resistance element being coupled to the first node; and
a first switch element configured to switch coupling and uncoupling between the second node and the third node,
the second circuit being configured to adjust a voltage difference between a gate voltage of the second transistor and a gate voltage of the first transistor by performing switching of the first switch element.

2. The semiconductor device according to claim 1, wherein the second circuit further includes a third circuit configured to shift a first voltage up to a second voltage, and
the second circuit performs the switching of the first switch element based on the second voltage.

3. The semiconductor device according to claim 2, wherein the first voltage is supplied from an outside of the semiconductor device.

4. The semiconductor device according to claim 2, wherein the first voltage is generated inside the semiconductor device.

5. The semiconductor device according to claim 2, wherein the first switch element is a third transistor, and
a first end of the third transistor is coupled to the second node, a second end of the third transistor is coupled to the third node, and the second voltage is applied to a gate of the third transistor.

6. The semiconductor device according to claim 2, wherein the third circuit includes:
an inverter, the first voltage being applied to an input terminal of the inverter, an output terminal of the inverter being coupled to a fourth node; and
a fourth transistor, a first end of the fourth transistor being grounded, a gate of the fourth transistor being coupled to the fourth node, and
the third circuit shifts the first voltage up to the second voltage by controlling the fourth transistor based on the first voltage.

7. The semiconductor device according to claim 6, wherein the first switch element is a third transistor,
the third transistor is turned off while the fourth transistor is in the OFF state, and
the third transistor is turned on while the fourth transistor is in the ON state.

8. The semiconductor device according to claim 6, wherein the third circuit further includes:
a first fuse resistance element, a first end of the first fuse resistance element being coupled to the input terminal of the inverter, a second end of the first fuse resistance element being grounded; and
a third resistance element, a third voltage being applied to a first end of the third resistance element, a second end of the third resistance element being coupled to the input terminal of the inverter.

9. The semiconductor device according to claim 8, wherein the first voltage is set to an L level or an H level depending on whether the first fuse resistance element is cut or not.

10. The semiconductor device according to claim 6, wherein the third circuit further includes:
a first fuse resistance element, a first end of the first fuse resistance element being coupled to the input terminal of the inverter, a second end of the first fuse resistance element being grounded; and
a second fuse resistance element, a third voltage being applied to a first end of the second fuse resistance element, a second end of the second fuse resistance element being coupled to the input terminal of the inverter.

11. The semiconductor device according to claim 10, wherein the first voltage is set to an L level or an H level depending on whether the first fuse resistance element is cut or not and whether the second fuse resistance element is cut or not.

12. The semiconductor device according to claim 1, wherein the second circuit includes:
a fourth resistance element, a first end of the fourth resistance element being coupled to a fifth node, a second end of the fourth resistance element being coupled to the first node; and
a second switch element configured to switch coupling and uncoupling between the second node and the fifth node, and
the second circuit is configured to adjust the voltage difference by further performing switching of the second switch element.

13. The semiconductor device according to claim 2, wherein the second circuit further includes:
a fourth resistance element, a first end of the fourth resistance element being coupled to a fifth node, a second end of the fourth resistance element being coupled to the first node;

a second switch element configured to switch coupling and uncoupling between the second node and the fifth node; and a fourth circuit configured to shift a fourth voltage up to a fifth voltage, and the second circuit is configured to adjust the voltage difference by further performing switching of the second switch element based on the fifth voltage.

\* \* \* \* \*